United States Patent
Lee et al.

(10) Patent No.: US 8,742,764 B2
(45) Date of Patent: Jun. 3, 2014

(54) METHOD AND APPARATUS FOR CHECKING INSULATION OF POUCH ELECTRIC CELL AND PROBE FOR THE SAME

(75) Inventors: Ju-Seok Lee, Chungbuk (KR); Hey-Woong Park, Daejeon (KR); Ju-Young Kim, Daejeon (KR); John E. Namgoong, Chungbuk (KR)

(73) Assignee: LG Chem, Ltd., Seoul (KR)

( * ) Notice: Subject to any disclaimer, the term of this patent is extended or adjusted under 35 U.S.C. 154(b) by 606 days.

(21) Appl. No.: 13/123,822

(22) PCT Filed: Oct. 12, 2009

(86) PCT No.: PCT/KR2009/005816
§ 371 (c)(1),
(2), (4) Date: Oct. 5, 2011

(87) PCT Pub. No.: WO2010/044572
PCT Pub. Date: Apr. 22, 2010

(65) Prior Publication Data
US 2012/0019256 A1    Jan. 26, 2012

(30) Foreign Application Priority Data
Oct. 13, 2008    (KR) .................. 10-2008-0100306

(51) Int. Cl.
*G01N 27/416*    (2006.01)
(52) U.S. Cl.
USPC .......................................... 324/437
(58) Field of Classification Search
USPC ......................................... 324/437
See application file for complete search history.

(56) References Cited

U.S. PATENT DOCUMENTS

| | | | | |
|---|---|---|---|---|
| 3,801,900 | A | * | 4/1974 | Szasz ............................ 324/671 |
| 2006/0068272 | A1 | * | 3/2006 | Takami et al. ................. 429/62 |
| 2010/0136389 | A1 | * | 6/2010 | Takagi ............................ 429/61 |

FOREIGN PATENT DOCUMENTS

| | | |
|---|---|---|
| JP | 60-70082 U | 5/1985 |
| JP | 3-67473 A | 3/1991 |
| JP | 11-219719 A | 8/1999 |
| JP | 2000-173644 A | 6/2000 |
| JP | 2008-51563 A | 3/2008 |
| KR | 10-2005-0062969 A | 7/2008 |
| WO | WO 2008/033064 A1 | 3/2008 |

* cited by examiner

Primary Examiner — Arun Williams
(74) Attorney, Agent, or Firm — Birch, Stewart, Kolasch & Birch, LLP (57) ABSTRACT

To check insulation of a pouch electric cell, probes are contacted to an electrode of a pouch electric cell and an aluminum layer of a pouch of the pouch electric cell, respectively, and then an electric characteristic value between the probes is measured. The probe contacted with the aluminum layer has a contact portion made of conductive elastic material. Also, insulation of the pouch electric cell is determined by comparing the measured electric characteristic value with a reference value. Thus, physical characteristics of an outer periphery of a flexible pouch may be sufficiently exhibited in measuring or checking insulation of a pouch electric cell such as insulation resistance, thereby improving reliability of electric contact and minimizing physical damage or deformation of the pouch electric cell.

15 Claims, 7 Drawing Sheets

Figure 9

# METHOD AND APPARATUS FOR CHECKING INSULATION OF POUCH ELECTRIC CELL AND PROBE FOR THE SAME

TECHNICAL FIELD

The present invention relates to method and apparatus for checking insulation of a pouch electric cell and a probe for the same. More particularly, the present invention relates to method and apparatus for checking insulation of a pouch electric cell, which may disperse or minimize a physical force occurring at physical contact between a probe and the pouch electric cell for measurement of electric characteristics to increase an electric contact area between the probe and the pouch electric cell, and also which may minimize damage or deformation of an appearance of the pouch electric cell, and a probe for the same.

BACKGROUND ART

A pouch electric cell has a battery cell therein, and a polymer wrapping corresponding to a pouch is provided to surround the battery cell.

Figure 1:
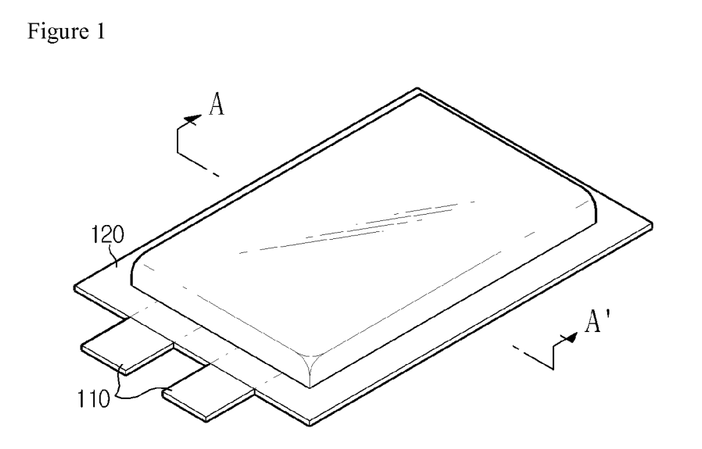
FIG. 1 is a perspective view showing an appearance of a pouch electric cell.
Figure 2:
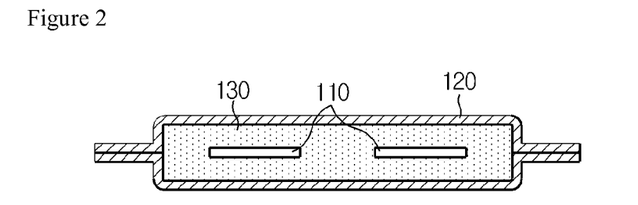
FIG. 2 is a sectional view taken along the line A-A' of FIG. 1.

With reference to FIG. 1 showing a perspective view of a pouch electric cell and FIG. 2 showing a sectional view taken along the line A-A' of FIG. 1, a pouch electric cell 100 includes an electrode 110, a pouch 120 and a battery cell 130.

Figure 3:
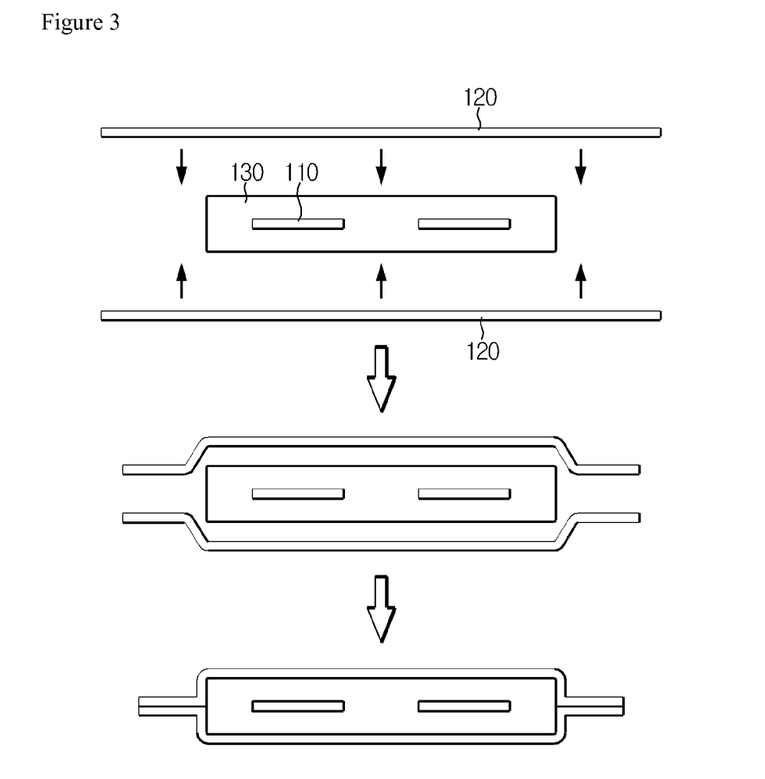
FIG. 3 is a schematic view illustrating the process of configuring a pouch electric cell.

To make such a pouch electric cell 100, as shown in FIG. 3, pouch raw materials of a predetermined size are adhered to the battery cell 130 from upper and lower portions thereof such that a pouch surrounds the battery cell 130.

This pouch 120 protects the battery cell 130, and the pouch 120 is made of aluminum foil to improve electric and chemical properties and heatproof property of the battery cell 130. Also, in order to ensure insulation of the battery cell 130 against the exterior, the aluminum foil is coated with an insulating material such as polyethylene terephthalate (PET) resin or nylon resin.

Figure 4:
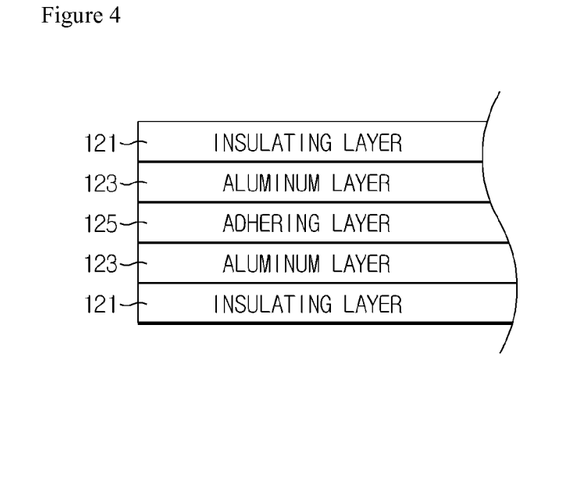
FIG. 4 is a sectional view showing an outer periphery of a pouch of the pouch electric cell.

In case the pouch is composed of upper and lower pouch portions adhered to each other as shown in FIG. 3, cast polypropylene (CPP) or polypropylene (PP) may be used for adhesion between them. In this case, a sealing surface where the pouch 120 is adhered may be configured with an insulating layer 121, an aluminum layer 123 and an adhering layer 125 as shown in FIG. 4.

If the inner structure of the pouch of the pouch electric cell 100 is broken or damaged due to an external physical impact and thus the pouch electric cell 100 loses its insulation, the battery cell does not keep a normal voltage but causes low voltage, which may also cause swelling of an interior battery cell.

This problem may causes consecutive problems such as explosion of the battery cell, which is crucial to users or equipped devices, so it is required to thoroughly check insulation of the pouch electric cell 100 and thus fundamentally eliminate any defect.

Figure 5:
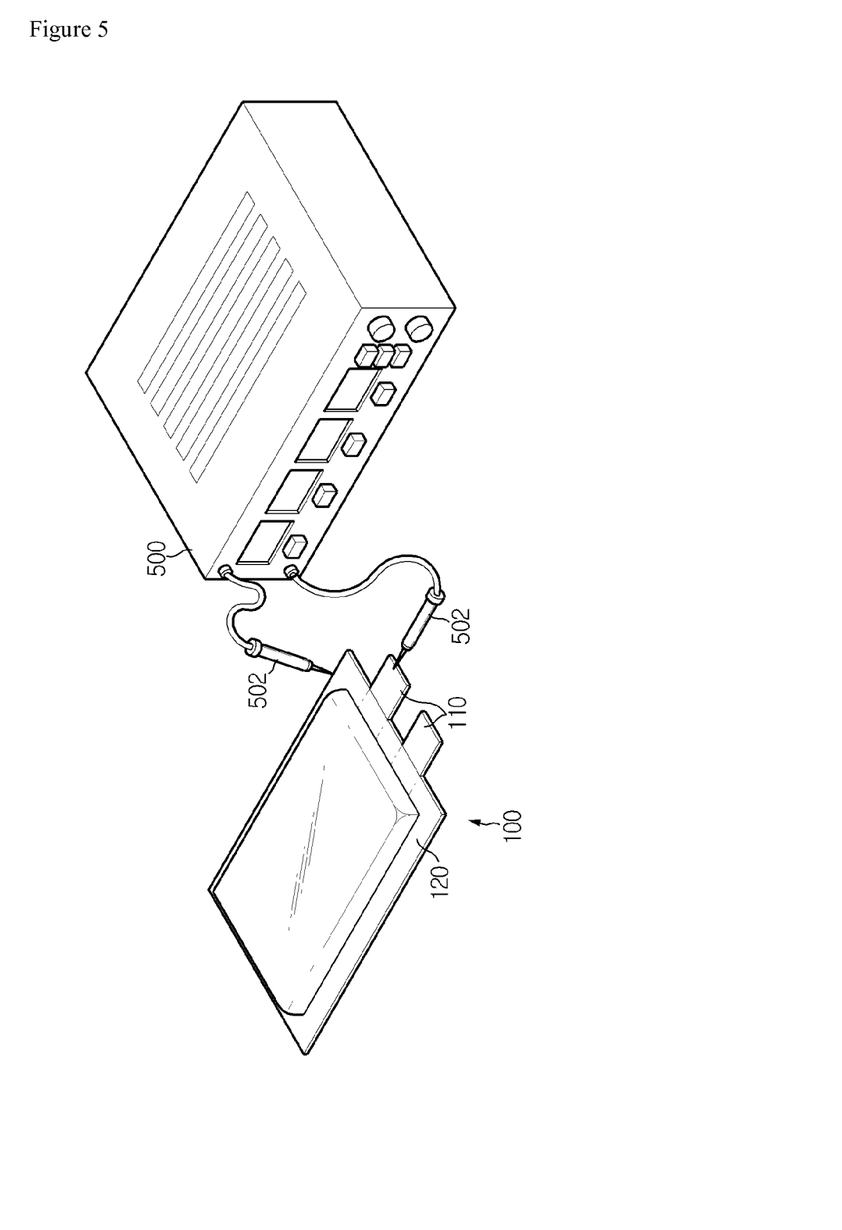
FIG. 5 is a perspective view showing a conventional insulation checking method.

Seeing a frequently used method for checking insulation of a pouch electric cell, as shown in FIG. 5, probes 502 are contacted respectively to an electrode 110 of the pouch electric cell 100 and an aluminum layer 123 at a side of the pouch 120, and then resistance between the contacted probes is measured using a measuring device 500 to check insulation.

In this method, the probe should be contacted to the aluminum layer 123 so as to measure insulation, but the probe 502 and the aluminum layer 123 make point contact, which does not ensure high reliability. In addition, if a force is applied to make a physical contact between the probe 502 and the aluminum layer 123, an outer periphery of the pouch may not endure the applied force due to its material but be easily deformed. Thus, the physical contact for electric connection between the probe 502 and the aluminum layer 123 may not be easily maintained, thereby giving difficulty to the checking process.

Due to the above circumstances, the reliability of the insulation checking for a pouch electric cell is very deteriorated though it consumes much time. In addition, it is difficult to eliminate an inferior battery cell, and the appearance of the pouch is still easily broken. Also, this conventional checking method becomes a serous obstacle in automating the insulation checking process for a pouch electric cell.

DISCLOSURE

Technical Problem

The present invention is designed to solve the problems of the prior art, and therefore it is an object of the present invention to provide method and apparatus for checking insulation of a pouch electric cell, which ensure good reliability and safety by improving material or shape of a contact portion of a probe so as to minimize or disperse an external physical force applied to a pouch of the pouch electric cell by a physical contact of a probe. The present invention is also directed to providing a probe for the same.

Other objects and advantages of the present invention will be explained below and understood by the following embodiments. Also, the objects and advantages of the present invention can be realized using components defined in the claims and their combinations.

Technical Solution

In order to accomplish the above object, the present invention provides a method for checking insulation of a pouch electric cell, which includes contacting probes to an electrode of a pouch electric cell and an aluminum layer of a pouch of the pouch electric cell, respectively; and measuring an electric characteristic value between the probes, wherein the probe contacted with the aluminum layer of the pouch electric cell has a contact portion made of conductive elastic material.

In order to implement a preferred embodiment, the method according to the present invention may further include determining insulation of the pouch electric cell by comparing the measured electric characteristic value with a reference value.

Also, the electric characteristic value is preferably at least one selected from the group consisting of resistance, current and voltage.

Along with it, to implement a further preferred embodiment, the contact portion may have a linear shape extended along a length direction of a side of the pouch, the contact portion may be shaped to be fitted to the side of the pouch, and the contact portion may be made of conductive silicon material.

In another aspect of the present invention, there is also provided an apparatus for checking insulation of a pouch electric cell, which includes probes electrically contacted to an electrode of a pouch electric cell and an aluminum layer of a pouch of the pouch electric cell, respectively, the probe contacted with the aluminum layer of the pouch having a contact portion made of conductive elastic material; and a measurement means for measuring an electric characteristic value between the probes.

Also, the checking apparatus according to the present invention may further include a determination unit for determining insulation of the pouch electric cell by comparing the measured electric characteristic value with a reference value.

In another aspect of the present invention, there is also provided a probe for measuring an electric characteristic value between an electrode of a pouch electric cell and an aluminum layer of a pouch of the pouch electric cell, wherein the probe has a contact portion electrically connected to the aluminum layer of the pouch electric cell, and the contact portion is made of conductive elastic material.

Advantageous Effects

The method and apparatus for checking insulation of a pouch electric cell and the pouch for the same according to the present invention may improve reliability of electric contact since physical characteristics of an outer periphery of a pouch may be sufficiently exhibited, and accordingly it is also possible to minimize error or inferiority in the checking process.

In addition, damage or deformation of an appearance of the pouch, which were caused in a conventional checking process, may be minimized, and also the pouch electric cell may be kept in an optimal state or improved better.

Along with it, cost and time required for checking insulation may be reduced. Further, the present invention gives a basis for automating the process of checking insulation of a pouch cell by structural improvement of a measuring device.

DESCRIPTION OF DRAWINGS

Other objects and aspects of the present invention will become apparent from the following description of embodiments with reference to the accompanying drawing in which.

BEST MODE

Hereinafter, preferred embodiments of the present invention will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present invention on the basis of the principle that the inventor is allowed to define terms appropriately for the best explanation.

Therefore, the description proposed herein is just a preferable example for the purpose of illustrations only, not intended to limit the scope of the invention, so it should be understood that other equivalents and modifications could be made thereto without departing from the spirit and scope of the invention.

Figure 6:
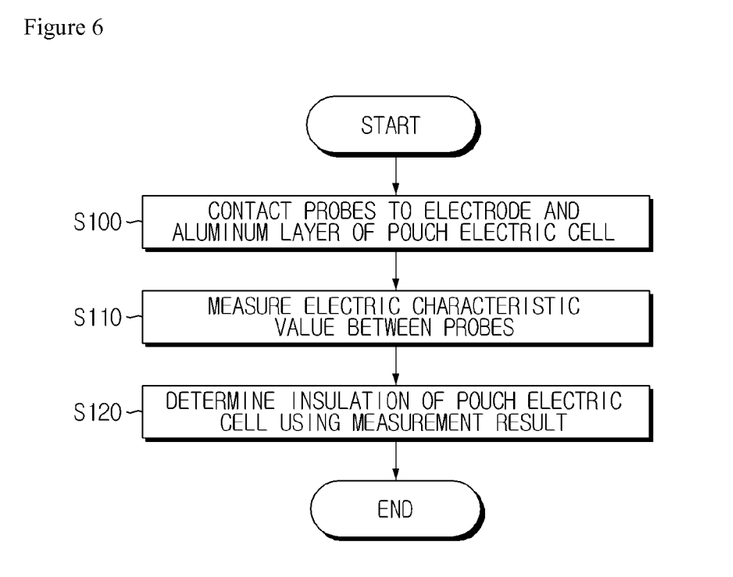
FIG. 6 is a flowchart illustrating a method for checking insulation of a pouch electric cell according to the present invention.

FIG. 6 is a flowchart illustrating a method for checking insulation of a pouch electric cell according to the present invention. As shown in FIG. 6, probes are contacted respectively to an electrode of a pouch electric cell and a side of a pouch, particularly a side where an aluminum layer is exposed (S100).

At this time, a contact portion of the probe, contacted to the aluminum layer of the pouch electric cell, is preferably made of conductive elastic material. In the conventional art, a metallic probe with no elasticity was used for measurement. However, in the present invention, the probe, particularly its contact portion contacted with an aluminum layer, is made of conductive elastic material as mentioned above, so it is possible to minimize damage of the electric layer and improve electric contact.

After the probes are contacted as mentioned above, an electric characteristic value of the contacted probes is measured (S110). The electric characteristic value is composed of at least one of resistance, current and voltage. In common cases, insulation resistance represents insulation, so a resistance value is preferably measured.

After that, in order to improve reliability of the insulation checking process and more effectively realize its automation, it is more preferred to compare the measured electric characteristic value with a reference value and thus determine insulation of the pouch electric cell (S120).

In other words, the probes are electrically connected to a predetermined checking device, which forms an electric circuit between the probes to measure electric characteristic values of the contacted probes and compares the measured electric characteristic value with a reference value to determine insulation of the pouch electric cell, thereby ensuring reliable measurement and determination.

Meanwhile, the electric characteristic value may be composed of at least one of resistance, current and voltage. Also, reference value data for resistance, current and voltage may be stored in a database, and the reference value may be compared with a received measured value for determining insulation.

For example, a pouch electric cell to be checked is in a good state, resistance of the pouch electric cell is ideally infinite, so a reference resistance value for determining insulation is set as a very large value over several hundred MΩ. In case an electric characteristic value related to current or voltage is used, a current or voltage value that may represent insulation may be set as a reference value. This example may be modified in various ways as apparent to those having ordinary skill in the art.

Figure 7:
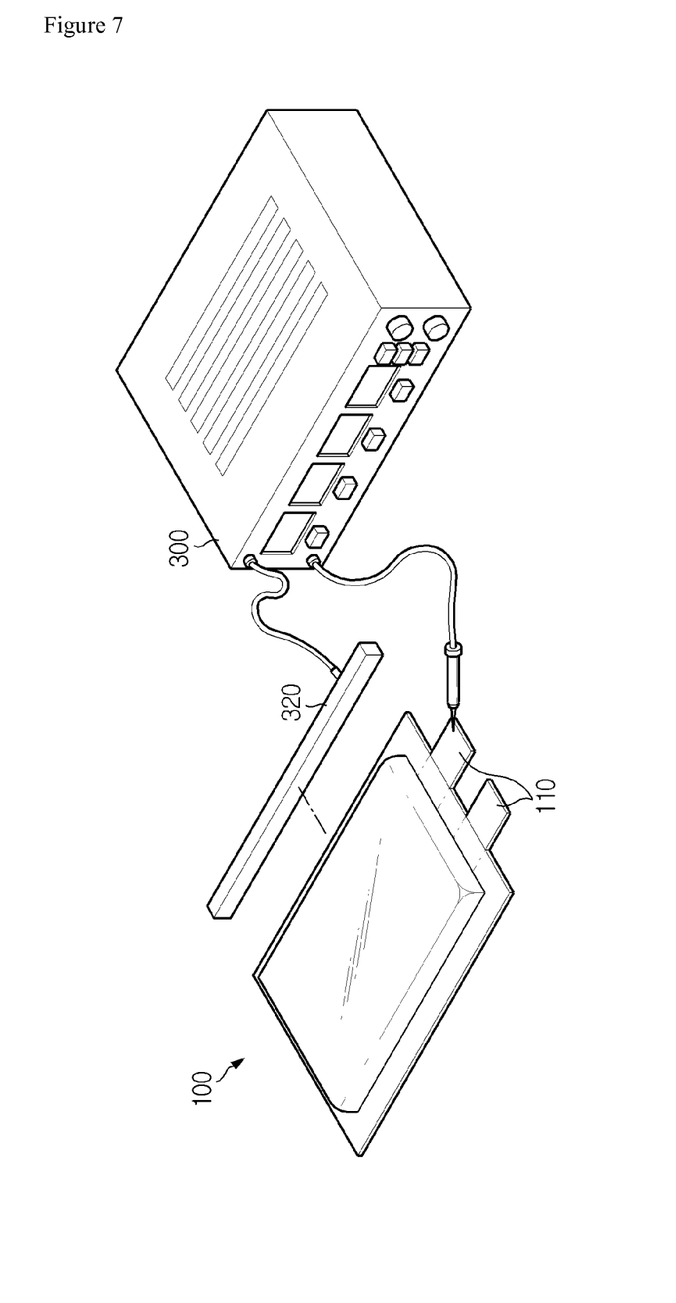
FIG. 7 is a perspective view illustrating an insulation checking process according to one embodiment of the present invention.

In addition, as shown in FIG. 7, a contact portion 320 of the probe contacted with the aluminum layer 123 preferably has a linear shape extended along a length direction of the side of the pouch so as to further enhance electric contact between the side of the pouch electric cell and the aluminum layer 123 such that the aluminum layer 123 makes a linear contact or an area contact with the probe, particularly the contact portion 320.

Figure 8:
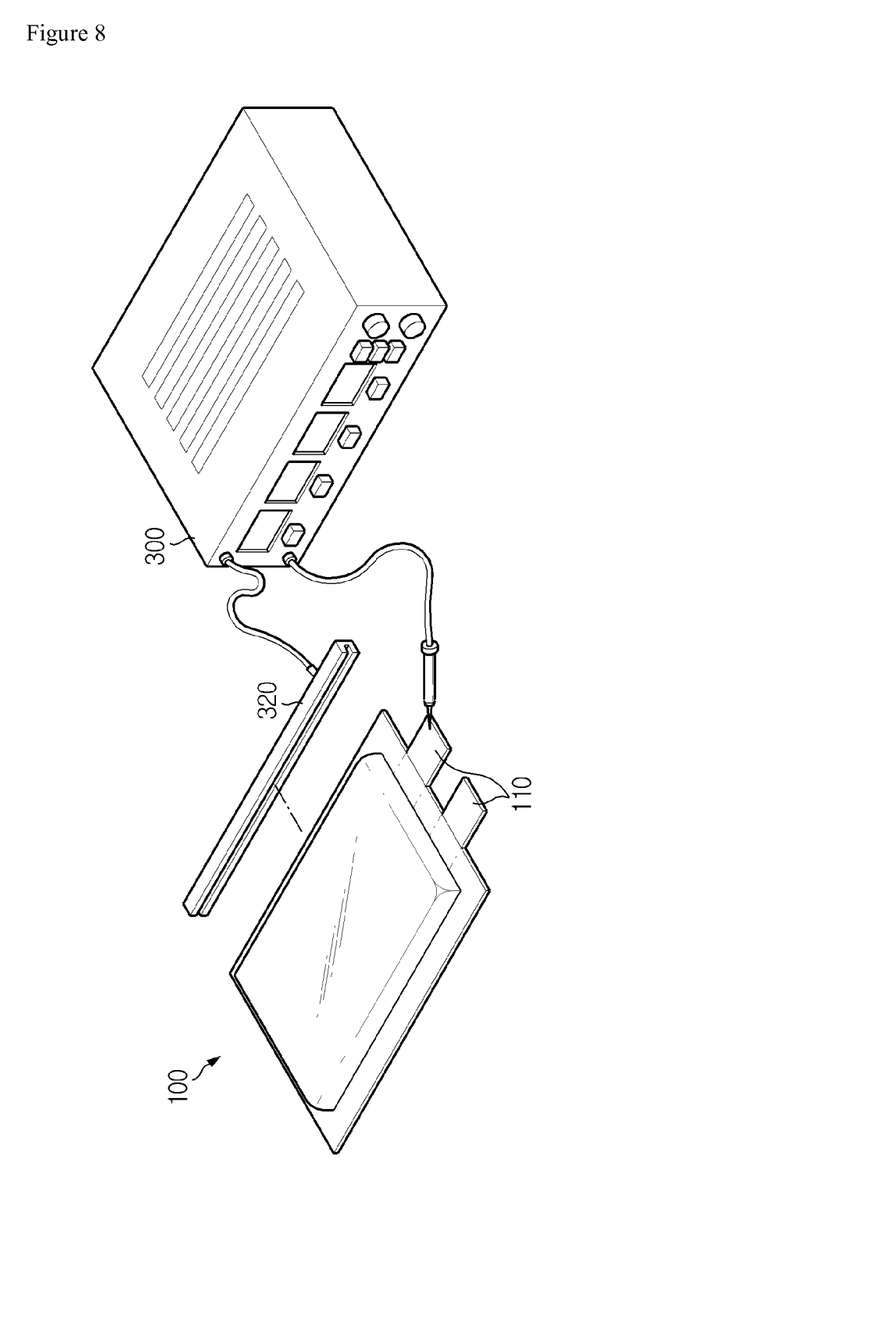
FIG. 8 is a perspective view illustrating an insulation checking process according to another embodiment of the present invention.

In FIGS. 7 and 8, the contact portion 320 of the probe is illustrated as having the same length as the aluminum layer of the pouch, but the length of the contact portion 320 may be changed variously if it ensure linear or area contact with a linear shape.

For better implementation, it is possible to fit the probe, particularly the contact portion 320, to a side of the pouch as shown in FIG. 8, and this configuration may ensure better electric contact and improved reliability for the measurement of insulation resistance.

As shown in FIGS. 7 and 8, the probes are respectively contacted with the electrode and the aluminum layer of the pouch electric cell, and the probes are also connected to a predetermined checking apparatus 300.

In case insulation of an electric cell is checked using the fitting-type probe of the present invention as explained above, the dependency on human resource may be minimized, thereby ensuring more rapid and accurate checking work.

The probe of the present invention, particularly the contact portion contacted with the aluminum layer, is made of conductive elastic material, and any material having conductivity and elasticity owing to its properties may be used. Conductive silicon rubber having high conductivity and high flexibility is preferred as the conductive elastic material.

Hereinafter, the checking apparatus 300 is described in detail with reference to FIG. 9.

Figure 9:
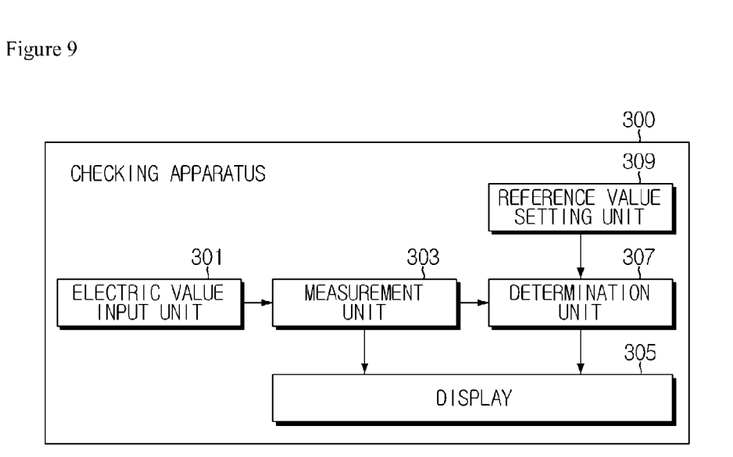
FIG. 9 is a block diagram showing an apparatus for checking insulation according to a preferred embodiment of the present invention.

As shown in FIG. 9, the checking apparatus 300 of the present invention includes an electric value input unit 301, a measurement unit 303, a display 305, a determination unit 307 and a reference value setting unit 309.

The electric value input unit 301 is electrically contacted with the electrode 110 and the aluminum layer 123 of the pouch electric cell, and the electric value input unit 301 is electrically connected to the probe whose contact portion contacted with the aluminum layer of the pouch electric cell is made of conductive elastic material.

If an electric characteristic value between the electrode and the aluminum layer, measured by the probe and input through the electric value input unit 301, is input to the checking apparatus 300 of the present invention, the input electric characteristic value is transferred to the measurement unit 303. Then, the measurement unit 303 measures the input electric characteristic value and then gives a resistance, current or voltage value as an output value to the display 305.

Also, the determination unit 307 reads a reference value of resistance current or voltage for the insulation checking of an electric cell from the reference value setting unit 309. Then, the determination unit 307 determines insulation of the electric cell by comparing the transferred measurement value with the reference value, and then outputs the determination result to the display 305.

The reference value setting unit 309 may store a database for the reference value to an internal memory or the like, and a user interface may be provided such that a user may input, change or set a reference value according to specifications of a checked object or checking environments.

Each component of the checking apparatus of the present invention should be understood as a logic component, rather than a physically distinguishable component. In other words, each component is corresponding to an element logically distinguished for realizing the spirit of the present invention, so each component should be understood as being included in the scope of the present invention if it may realize its logic function though it is separately implemented or integrated with another component.

The present invention has been described in detail. However, it should be understood that the detailed description and specific examples, while indicating preferred embodiments of the invention, are given by way of illustration only, since various changes and modifications within the spirit and scope of the invention will become apparent to those skilled in the art from this detailed description.

The invention claimed is:

1. A method for checking insulation of a pouch electric cell, comprising:
    contacting probes to an electrode of a pouch electric cell and an aluminum layer of a pouch of the pouch electric cell, respectively; and
    measuring an electric characteristic value between the probes,
    wherein the probe contacted with the aluminum layer of the pouch electric cell has a contact portion made of conductive elastic material.

2. The method for checking insulation of a pouch electric cell according to claim 1, further comprising:
    determining insulation of the pouch electric cell by comparing the measured electric characteristic value with a reference value.

3. The method for checking insulation of a pouch electric cell according to claim 1, wherein the electric characteristic value is at least one selected from the group consisting of resistance, current and voltage.

4. The method for checking insulation of a pouch electric cell according to claim 1, wherein the contact portion has a linear shape extended along a length direction of a side of the pouch.

5. The method for checking insulation of a pouch electric cell according to claim 4, wherein the contact portion is shaped to be fitted to the side of the pouch.

6. An apparatus for checking insulation of a pouch electric cell, comprising:
    probes electrically contacted to an electrode of a pouch electric cell and an aluminum layer of a pouch of the pouch electric cell, respectively, the probe contacted with the aluminum layer of the pouch having a contact portion made of conductive elastic material; and
    a measurement means for measuring an electric characteristic value between the probes.

7. The apparatus for checking insulation of a pouch electric cell according to claim 6, further comprising: a determination means for determining insulation of the pouch electric cell by comparing the measured electric characteristic value with a reference value.

8. The apparatus for checking insulation of a pouch electric cell according to claim 6, wherein the electric characteristic value is at least one selected from the group consisting of resistance, current and voltage.

9. The apparatus for checking insulation of a pouch electric cell according to claim 6, wherein the contact portion has a linear shape extended along a length direction of a side of the pouch.

10. The apparatus for checking insulation of a pouch electric cell according to claim 9, wherein the contact portion is shaped to be fitted to the side of the pouch.

11. A probe for measuring an electric characteristic value between an electrode of a pouch electric cell and an aluminum layer of a pouch of the pouch electric cell,
    wherein the probe has a contact portion electrically connected to the aluminum layer of the pouch, and the contact portion is made of conductive elastic material.

12. The probe according to claim 11, wherein the probe has a linear shape extended along a length direction of a side of the pouch.

13. The probe according to claim 11, wherein the contact portion is shaped to be fitted to the side of the pouch.

14. The probe according to claim 11, wherein the contact portion is made of conductive silicon rubber material.

15. The method of claim 1, wherein the conductive elastic material comprises a conductive silicon rubber.

* * * * *